(12) United States Patent
Mills et al.

(10) Patent No.: US 8,023,275 B2
(45) Date of Patent: Sep. 20, 2011

(54) INTERFACE RETENTION AND SUPPORT APPARATUS AND METHOD OF USE

(75) Inventors: Richard S. Mills, Cedar Park, TX (US); Edmond I. Bailey, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 12/970,226

(22) Filed: Dec. 16, 2010

(65) Prior Publication Data

US 2011/0086520 A1    Apr. 14, 2011

Related U.S. Application Data

(62) Division of application No. 11/753,674, filed on May 25, 2007, now Pat. No. 7,876,576.

(51) Int. Cl.
*H05K 5/00* (2006.01)
(52) U.S. Cl. .................. 361/759; 361/786; 361/760
(58) Field of Classification Search .................. 361/759, 361/786, 760; 439/64, 55
See application file for complete search history.

(56) References Cited

U.S. PATENT DOCUMENTS

| | | | |
|---|---|---|---|
| 5,440,755 A | 8/1995 | Harwer et al. | |
| 5,781,414 A * | 7/1998 | Mills et al. | 361/786 |
| 6,504,725 B1 * | 1/2003 | Lam | 361/785 |
| 6,608,759 B1 | 8/2003 | Barringer et al. | |
| 6,754,084 B1 | 6/2004 | Bolognia et al. | |
| 7,140,900 B1 * | 11/2006 | Villanueva | 439/327 |
| 2008/0101011 A1 | 5/2008 | Carr et al. | |

* cited by examiner

*Primary Examiner* — Yuriy Semenenko
*Assistant Examiner* — Andargie M Aychillhum
(74) *Attorney, Agent, or Firm* — Larson Newman, LLP

(57) ABSTRACT

An information handling system includes a printed circuit board and an extension card. The printed circuit board includes a first expansion terminal. The extension card includes a first coupling interface, a retention mechanism, and an access terminal. The first coupling interface is operable to engage the first expansion terminal. The retention mechanism is operable to be coupled to at least a first exterior portion of the first expansion terminal to secure the first coupling interface to the first expansion terminal. The access terminal is operably coupled to the first coupling interface, and the access terminal is electrically coupled the first expansion terminal to access terminal.

18 Claims, 5 Drawing Sheets

INTERFACE RETENTION AND SUPPORT APPARATUS AND METHOD OF USE

CROSS-REFERENCE TO RELATED APPLICATIONS

This application is a divisional of U.S. patent application Ser. No. 11/753,674 entitled "Interface Retention and Support Apparatus and Method of Use," filed on May 25, 2007, the disclosure of which is hereby expressly incorporated by reference in its entirety.

FIELD OF THE DISCLOSURE

This disclosure relates generally to information handling systems, and more particularly to an interface retention and support apparatus and method of use.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Various information handling systems can be realized as servers mounted within server racks. For example, servers can allow for accessing and serving information, applications, and various types of data to multiple clients via an Intranet, the Internet, or combinations thereof. The complexity and density of servers, and associated components for some enterprise data centers, can impact installation and maintenance of servers within a data center. For example, cables in dense server configurations can be cumbersome and may require additional hardware, mounting brackets, housings, and other hardware to support cables. Given the density of servers and server configurations within server racks, hardware to support cabling may not be easily accessible and can require use of various types of additional tools, extensions, etc. to access, install, or replace cables and components within servers.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
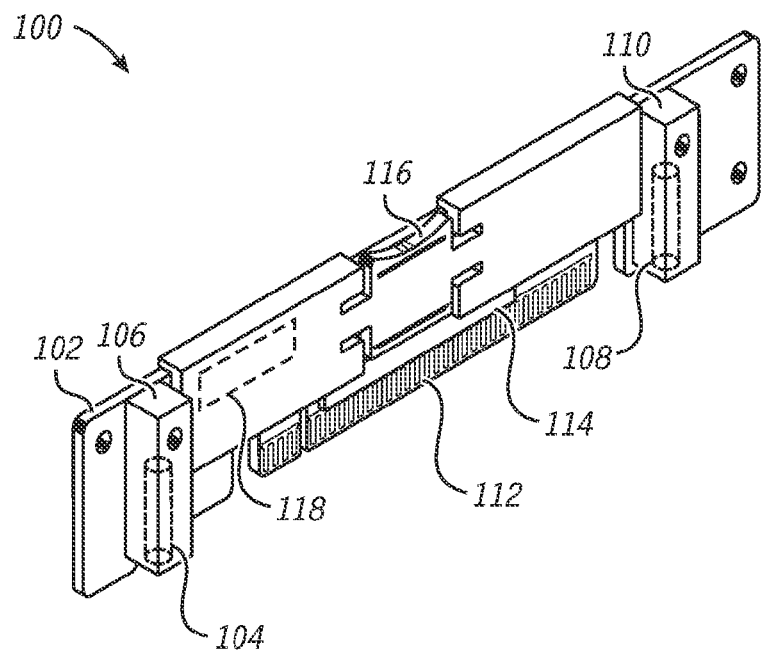
FIG. 1 illustrates a perspective view of an extension card employing a retention and support apparatus according to one aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. The teachings can also be utilized in other applications and with several different types of architectures such as distributed computing architectures, client/server architectures, or middleware server architectures and associated components.

For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and can vary in size, shape, performance, functionality, and price. The information handling system can include memory, one or more processing resources such as a central processing unit (CPU) or hardware or software control logic. Additional components of the information handling system can include one or more storage devices, one or more communications ports for communicating with external devices as well as various input and output (I/O) devices, such as a keyboard, a mouse, and a video display. The information handling system can also include one or more buses operable to transmit communications between the various hardware components.

According to one aspect of the disclosure, an extension apparatus can include a first coupling interface operable to be coupled to a first expansion terminal of a printed circuit board. The apparatus can also include a retention mechanism aligned to a surface of the first coupling interface. The retention mechanism can be used to engage a first exterior surface of the first expansion terminal upon coupling the first coupling interface to the first expansion terminal. The apparatus can further include an access terminal operably coupled to the first coupling interface and an expansion circuit coupled between the first coupling interface and the access terminal. The expansion circuit can electrically couple the first expansion terminal to the access terminal.

According to another aspect of the disclosure, a method of using an extension apparatus is disclosed. The method can include locating a first expansion terminal of a printed circuit board and aligning a first guide block to a first guide pin proximally located to the first expansion terminal. The method can also include aligning a second guide block to a second guide pin proximally located to the first expansion terminal, and aligning a first coupling interface to the first expansion terminal. The method can further include actuating a retention mechanism of the first coupling interface, and coupling the first coupling interface to the expansion terminal. The method can also include de-actuating the retention mechanism to couple a retention coupler of the retention mechanism to a first exterior portion of the expansion terminal.

According to a further aspect of the disclosure, an information handling system is disclosed. The information handling system can include a printed circuit board including a first expansion terminal, and a first guide pin operably associated with the printed circuit board and the first expansion terminal. The information handling system can also include a second guide pin operably associated with the printed circuit board and the first expansion terminal, and a first extension card. The first extension card can include a first guide block coupled to a substrate and operable to be aligned with the first guide pin, and a second guide block coupled to the substrate and operable to be aligned with the second guide pin. The first extension card can also include a first coupling interface operable to engage the first expansion terminal, and a retention mechanism operable to be coupled to at least a first exterior portion of the expansion terminal to secure the first coupling interface to the expansion terminal. The first extension card can further include an access terminal operably coupled to the first coupling interface, and an expansion circuit coupled between the first coupling interface and the access terminal. The expansion circuit can be used to electrically couple the expansion terminal to the access terminal.

FIG. 1 illustrates a perspective view of an extension apparatus, illustrated generally as an extension card 100, according to one aspect of the disclosure. The extension card 100 can include a substrate 102 having a first guide block 104 coupled near a first side portion 106 of the extension card 100. The extension card 100 can also include a second guide block 108 coupled near a second side portion 110 of the extension card 100. In one form, the first guide block 104, the second guide block 108, or any combination thereof, can be located at various positions or locations along the substrate 102 or other portions of the extension card 100 as desired.

The extension card 100 can also include a first coupling interface 112 coupled to the substrate 102 and sized to engage an expansion terminal of a circuit board of an information handling system (not expressly shown). The first coupling interface 112 includes one or more conductors electrically coupled to an access terminal 118 operable to be coupled to an expansion card, cable, module, or any other device or component that can be accessed using the access terminal 118 and first coupling interface 112. The extension card 100 can also include a retaining coupler 114 and an actuator 116 that can be activated and deactivated as a tool-less actuator. For example, the actuator 116 can include a spring or tension activated actuator that can be compressed and released to displace the retaining coupler 114 away from portions of the substrate 102 or first coupling interface 112. Other mechanism can also be employed. As such, a user can press the actuator 116 during installation and removal of the extension card 100 and deactivate the actuator 116 to mount the extension card 100 to an expansion terminal of an information handling system.

Figure 2:
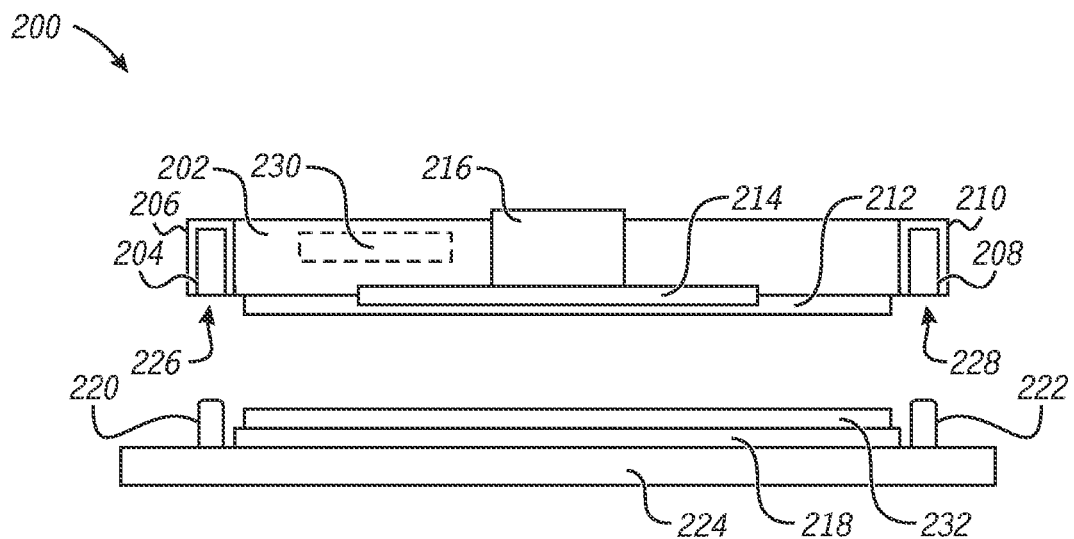
FIG. 2 illustrates a front view of an extension card and circuit board mount according to one aspect of the disclosure.

FIG. 2 illustrates a front view of an extension card, illustrated generally at 200, and a circuit board mount according to one aspect of the disclosure. The extension card 200 can include a substrate 202 having a first guide block 204 coupled near a first side portion 206 of the extension card 200. The extension card 200 can also include a second guide block 208 coupled near a second side portion 210 of the extension card 200. In one form, the first guide block 204, the second guide block 208, or any combination thereof, can be located at various positions or location along the substrate 202 or other portions of the extension card 200 as desired.

The extension card 200 can also include a first coupling interface 212 coupled to the substrate 202 and sized to engage an expansion terminal of a circuit board of an information handling system (not expressly shown). The first coupling interface 212 can be electrically coupled to an access terminal 230. The extension card 200 can also include a retaining coupler 214 and an actuator 216 that can be activated and deactivated as a tool-less actuator. For example, the actuator 216 can include a spring or tension activated actuator that can be compressed and released to displace the retaining coupler 214 away from portions of the substrate 202 or first coupling interface 212.

The extension card 200 can be coupled to a circuit board 218 using a first guide pin 220 that can be aligned with a first opening 226 of the first guide block 206, and a second guide pin 222 that can be aligned with a second opening 228 of the second guide block 208. The circuit board 218 can be operable to connect electrical components (not illustrated) and in one form, circuit board mount 224 can be secured to a server rack or other form of information handling system mount. According to one aspect, the first guide pin 220, the second guide pin 222, or any combination thereof, can be incorporated as a part of the circuit board 218 or the circuit board mount 224 as desired. In one form, the extension card 200 can include a low profile extension card that can be used to ensure additional interfaces, cables, connectors, modules, etc. can be connected, mounted, routed, etc. along a portion of the circuit board 218 as desired.

During use, a user can install the extension card 200 by actuating actuator 216 causing the retaining coupler 214 to extend from the substrate 202. A user can couple the first coupling interface 212 to an expansion terminal 232 of the circuit board 218. For example, the expansion terminal 232 can include a slot or channel (not illustrated) that can receive the first coupling interface 212. Additionally, the first guide block 204 can receive the first guide pin 220, and the second guide pin block 208 can receive the second guide pin 222. The user can then release the actuator 216, and the retaining coupler 214 can engage a portion of the expansion terminal 232 to secure the retaining coupler 214 to the expansion terminal 232. As such, a user can activate the actuator 216 during installation of the extension card 200 and deactivate the actuator 216 upon mounting the extension card 200 to the expansion terminal 232 of an information handling system to secure the extension card 200 to the expansion terminal 232. Additionally, a user can couple a cable, module, hardware, etc. to the access terminal 230, and a weight or force associated with mounting the cabling, modules, hardware, etc. can be reduced using the first guide block 204 and the second guide block 208 operable to support the additional weight or force.

According to a further aspect, the circuit board 218 can be provided as a communication module that can be coupled to an information handling system. For example, the circuit board 218 can include a communication module that can employ a high-speed communication bus such as a PCI-Express bus. A PCI-Express bus can be operated at more than one (1) speed (e.g. 2.5 GHz and 5 GHz) and can be configured to comply with industry standards for connecting and communicating between various PCI-enabled hardware devices. In one form, a PCI-enabled bus can be provided using a PCI specification such as "PCI Local Bus Specification," Version 3.0 dated Feb. 3, 2004 or other PCI specifications as desired. According to another aspect, the circuit board 218 in combination with the extension card 200 can be used within a "1 U" sized server that can employ tool-less vertical riser cables to connect servers within a server rack. For example, a riser cable can be coupled to the access terminal 230 to access the circuit board 218 and can be coupled to the extension card 200 using the first coupling interface 212 and the expansion terminal 232.

Figure 3:
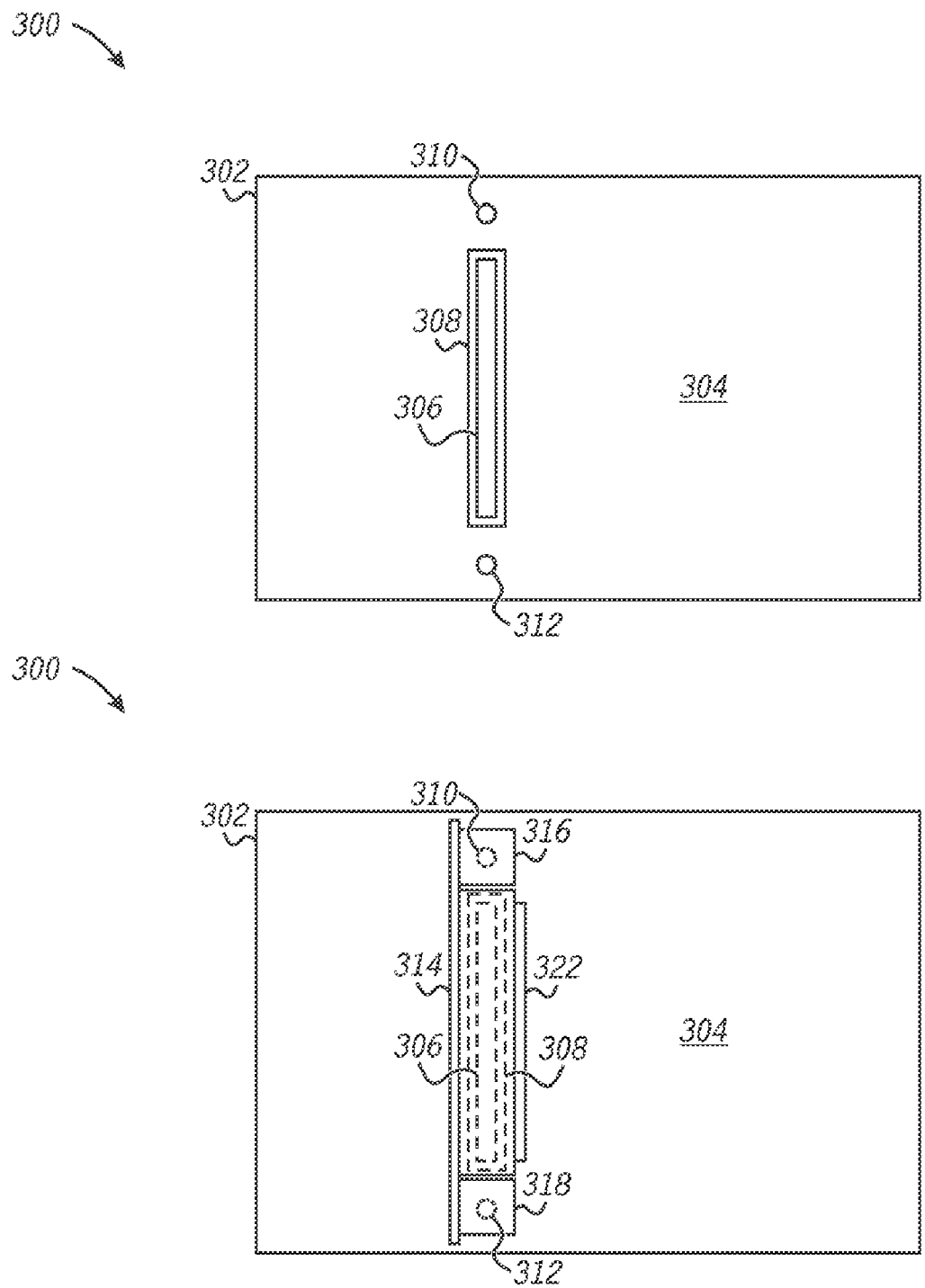
FIG. 3 illustrates a top view of a circuit board employing an expansion terminal and guide pins operable to couple an extension card according to one aspect of the disclosure.

FIG. 3 illustrates a top view of a circuit board, illustrated generally at 300, employing an expansion terminal and guide pins operable to couple an extension card according to one aspect of the disclosure. The circuit board 300 can include a substrate 302 having a first surface 304, and an expansion terminal 306 including an expansion terminal housing 308. The expansion terminal 306 can be interfaced by an extender card or expansion card to provide access to one or more resources as desired. The circuit board 300 can also include a first guide pin 310 and a second guide pin 312 located proximally to an expansion terminal housing 308.

The expansion terminal 306, the first guide pin 310, and the second guide pin 312, can be used to mount an extension card 314. For example, the extension card 314 can include a first guide block 316 that can engage the first guide pin 310. The extension card 314 can also include a second guide block 318 that can engage the second guide pin 312. Additionally, the extension card 314 can also include a side portion 320 having a retaining coupler 322 that can be coupled to a portion of the expansion terminal housing 308 when coupled to the expansion terminal 306.

Figure 4:
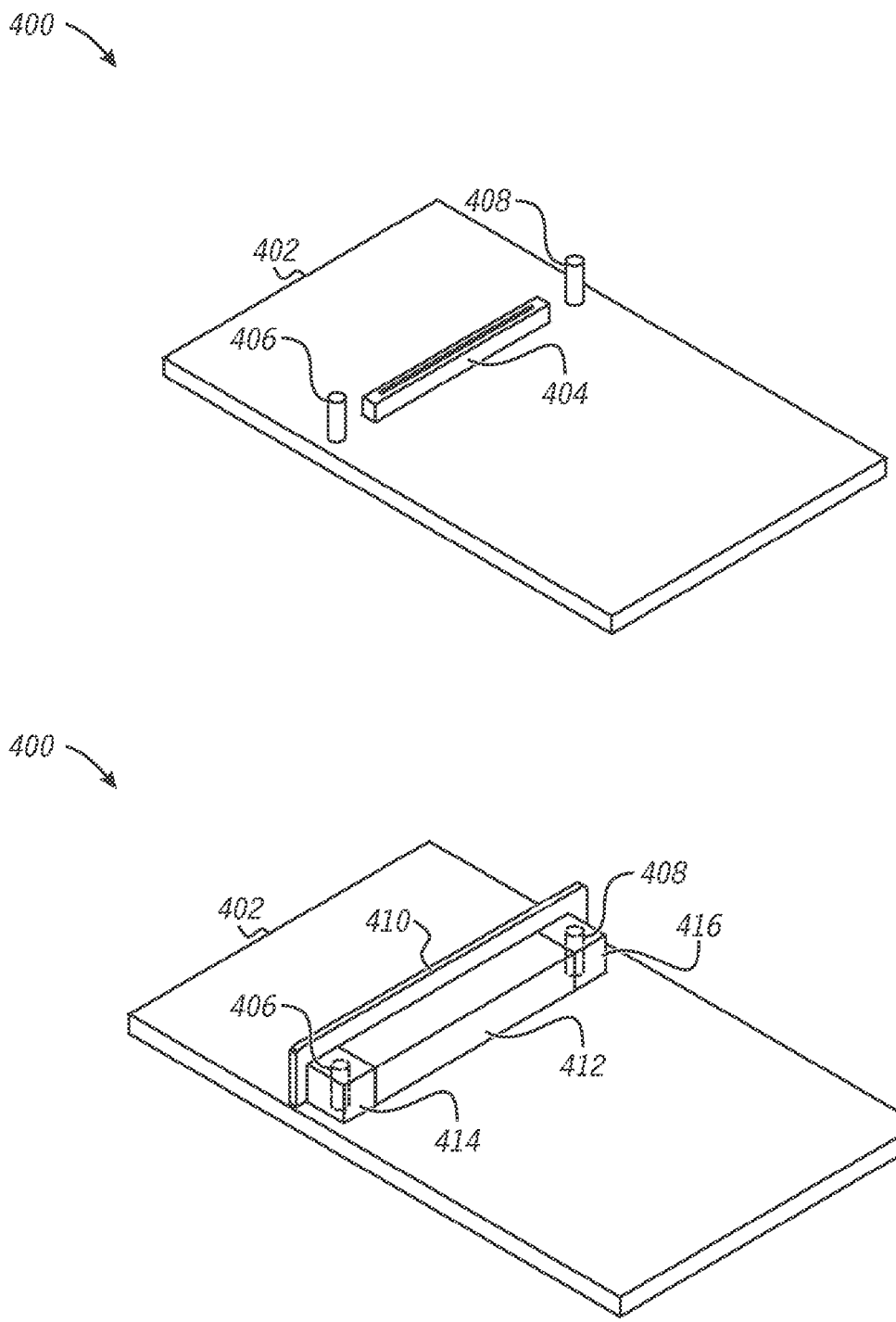
FIG. 4 illustrates a perspective view of circuit card employing an expansion terminal and guide pins operable to be coupled to an extension card according to one aspect of the disclosure.

FIG. 4 illustrates a perspective view of circuit board, illustrated generally at 400, employing an expansion terminal and guide pins operable to be coupled to an extension card according to one aspect of the disclosure. The circuit board 400 can include a substrate 402 and an expansion terminal 404. The expansion terminal 404 can be located proximal to the first guide pin 406 and a second guide pin 408 to allow for mounting an extension card 410. The extension card 410 can also include a retention mechanism 412, a first guide block 414 operable to be coupled to a first guide pin 406, and a second guide block 416 operable to be coupled to the second guide pin 408. The retention mechanism 412 can also engage an exterior portion of the expansion terminal 404 to secure the extension card 410 to the expansion terminal 404.

Figure 5:
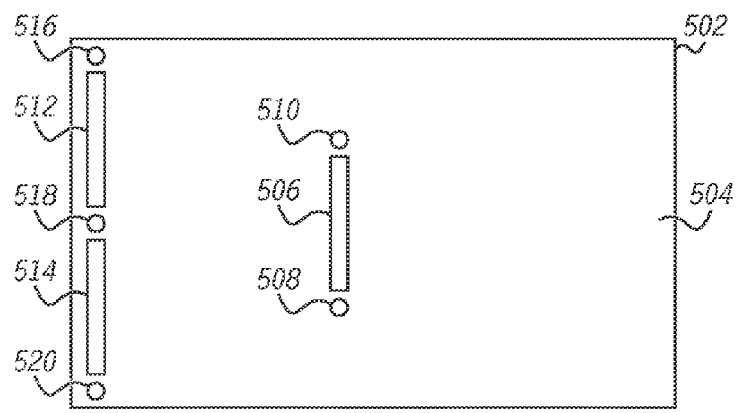
FIG. 5 illustrates a top view of a circuit board incorporating multiple expansion terminals and associated mounting pins according to one aspect of the disclosure.

FIG. 5 illustrates a top view of a circuit board, illustrated generally at 500, incorporating multiple expansion terminals and associated mounting pins according to one aspect of the disclosure. The circuit board 500 can include a substrate 502 having a first surface 504 and a first expansion terminal 506 located along the first surface 504. The first expansion terminal 506 can also include a first guide pin 508 and a second guide pin 510 proximally located to the first expansion terminal 506. The circuit board 500 can also include a second expansion terminal 512, and a third expansion terminal 512. The second expansion terminal 512 can be proximally located to a third guide pin 516, and a fourth guide pin 518 placed between the second expansion terminal 512, and the third expansion terminal 514. A fifth guide pin 520 can also be located proximal to the third expansion terminal 514. During use, an extension card, such as extension card 200 illustrated in FIG. 2 can be coupled to the first expansion terminal 506. In another form, an extension card such as extension card 600 illustrated in FIG. 6 below can be coupled to the second expansion terminal 512 and the third expansion terminal 514. For example, the third guide pin 516, the fourth guide pin 518, and the fifth guide pin 520 can be used to mount an extension card 600 to the circuit board 500.

Figure 6:
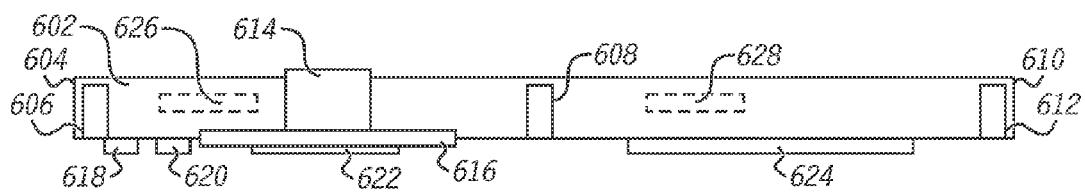
FIG. 6 illustrates a front view of an extension card employing multiple guide blocks and terminal interfaces according to one aspect of the disclosure.

FIG. 6 illustrates a front view of an extension card, illustrated generally at 600, employing multiple guide blocks and terminal interfaces according to one aspect of the disclosure. The extension card 600 can include a substrate 602 having a first side portion 604 and a first guide block 606. The extension card 600 can also include a second guide block 608, and a third guide block 610 proximally located to a second side portion 612. The extension card 600 can further include an actuator 614, and a retaining coupler 616 proximally located to a first terminal interface 618, and a second terminal interface 620. The extension card 600 can further include a third terminal interface 622 and a fourth terminal interface 624. In one form, one or more of the first terminal interface 618, the second terminal interface 620, the third terminal interface 622, the fourth terminal interface 624, or any combination thereof, can be combined to form a terminal interface. Additionally, each terminal can be sized as desired. The extension card 600 can also include a first access terminal 626 and a second access terminal 628 that can be coupled to one or more of the terminal interfaces 618, 620, 624, and 626.

The extension card 600 can be coupled to the circuit board 500 illustrated in FIG. 5. For example, the extension card 600 can be aligned with the third guide pin 516, the fourth guide pin 518, and the fifth guide pin 520. The extension card 600 can be coupled to the second expansion terminal 512, and the third expansion terminal 514 of the circuit board 500. As such, the extension card 600 having multiple terminal interfaces 618, 620, 624, 626, can be used to enable access to resources of the circuit board 500 using the access terminals 626, 628 as desired.

Figure 7:
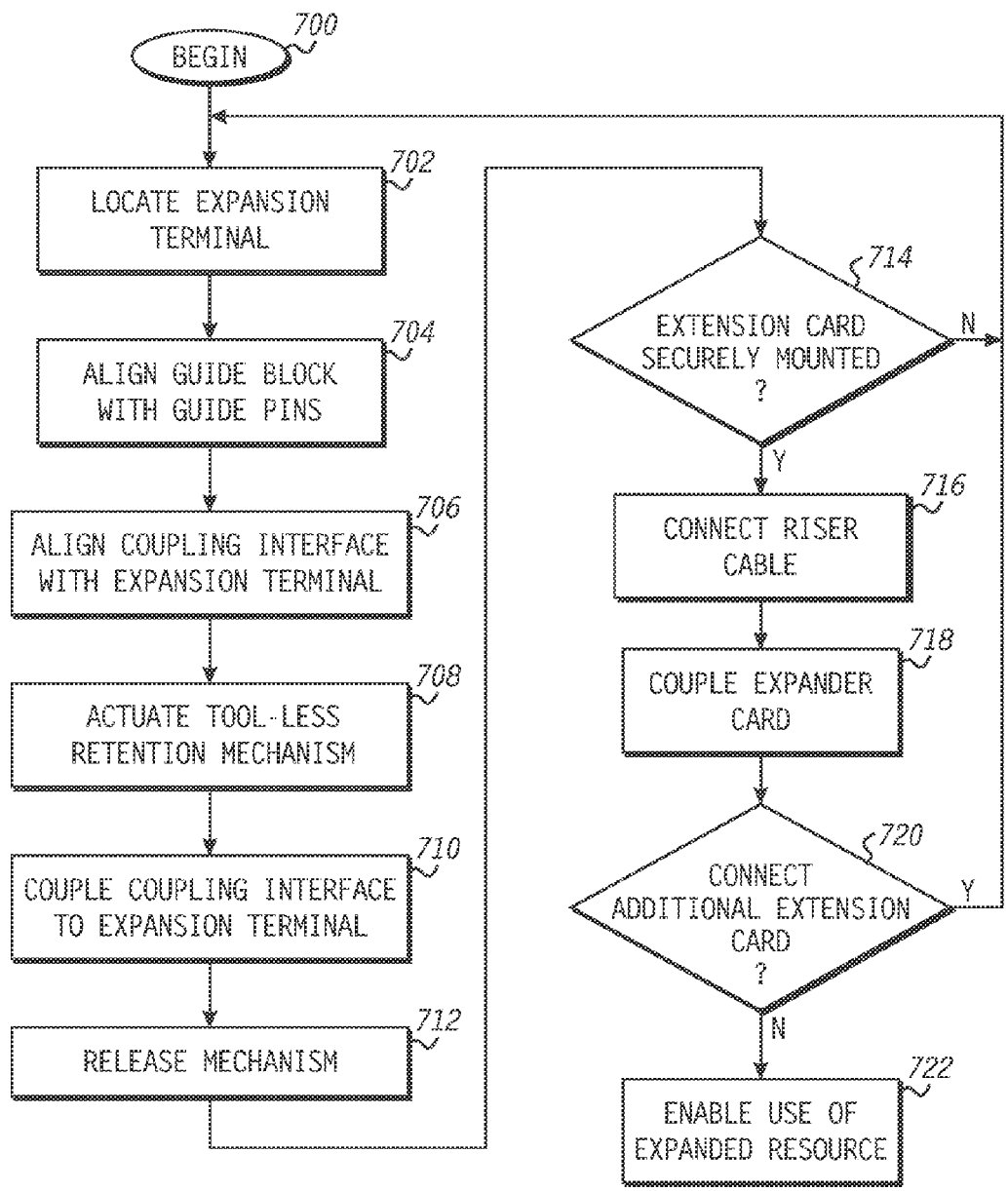
FIG. 7 illustrates a flow diagram of a method of installing an extension card within an expansion terminal of an information handling system according to one aspect of the disclosure.

FIG. 7 illustrates a flow diagram of a method of installing an extension card within an expansion terminal of an information handling system according to one aspect of the disclosure. The method begins generally at block 700. At block 702, a user can locate an expansion terminal 702 of a circuit board of an information handing system. The expansion terminal can include guide pins operable to receive a guide block of an extension card, and at block 704, a user can align the guide blocks of the extension card to the guide pins associated with the expansion terminal. The method can then proceed to block 706, and a user can align a coupling interface of the extension card with the expansion terminal, and at block 708 actuate a tool-less retention mechanism. For example, a user can compress or actuate an actuator of a retention mechanism that can be hand operated. The tool-less retention mechanism can extend away from a portion of the extension card, and a user can couple the coupling interface to the expansion terminal at 710. For example, the first retention mechanism can include a tension coupling element, such as a tension clip, or other form of retaining device operable to produce tension to secure the extension card to the expansion terminal. In other forms, a first retaining mechanism, a second retaining mechanism, or any combination or additions thereof, can be used.

A user can then release the mechanism at block 712 and at decision block 714, if the extension card is not securely coupled to the expansion terminal, the method can proceed to block 702 and repeat. If at decision block 714, the extension card is coupled to the expansion terminal, the method can proceed to block 716 and a riser cable can be coupled to an access terminal of the extension card. The method can then proceed to block 718 and an expander card or other module can be coupled to access terminal of the extension card. Upon coupling one or both of the expander card, module, riser cable, etc. the method can proceed to decision block 720, and if additional extension cards are to be installed, the method can repeat at block 702. If no additional extension cards are to be installed, the method can proceed to block 722, and the information handling system can enable use of one ore more resource using an extension card.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a printed circuit board including a first expansion terminal; and
   an extension card including:
      a first coupling interface operable to engage the first expansion terminal;
      a retention mechanism operable to be coupled to at least a first exterior portion of the first expansion terminal to secure the first coupling interface to the first expansion terminal, the retention mechanism including:
         a vertical surface operable to be positioned along the first exterior side surface of the first expansion terminal;
         a horizontal surface coupled to the vertical surface to form a retaining coupler; and
         an actuator operably coupled to the vertical surface and the horizontal surface, the actuator operable to place the retaining coupler around a portion of the first exterior surface of the first expansion terminal; and
      an access terminal operably coupled to the first coupling interface, wherein the access terminal is electrically coupled the first expansion terminal to access terminal.

2. The information handling system of claim 1, wherein the extension card further comprises:
   a first guide block coupled to a substrate and operable to be aligned with a first guide pin of the printed circuit board; and
   a second guide block coupled to the substrate and operable to be aligned with a second guide pin of the printed circuit board.

3. The information handling system of claim 2, wherein:
   the first guide block includes a first guide block contact surface operable to engage a first guide pin mounting site, the first guide block contact surface operable to reduce a mounting force of the first expansion terminal; and
   the second guide block includes a second guide block contact surface operable to engage a second guide pin mounting site, the second guide block contact surface operable to reduce the mounting force of the first expansion terminal.

4. The information handling system of claim 1, further comprising a printed extension card including the first coupling interface.

5. The information handling system of claim 1, wherein the retention mechanism includes a tool-less retention mechanism.

6. The information handling system of claim 1, further comprising:
   a second coupling interface operable to engage a second expansion terminal of the printed circuit board, and the second coupling interface is electrically coupled the second expansion terminal to the access terminal.

7. The information handling system of claim 6, further comprising:
   a first guide block operable to be aligned with a first guide pin of the printed circuit board;
   a second guide block positioned between the first expansion terminal and the second expansion terminal, the second guide block operable to be aligned to a second guide pin operably associated with the first guide pin; and
   a third guide block operable to be aligned with a third guide pin of the printed circuit board, the third guide pin operably associated with the first guide pin and the second guide pin.

8. The information handling system of claim 1, wherein:
   the first expansion terminal includes a PCI Express enabled communication interface; and
   the access terminal is operable to be coupled to a PCI Express enabled module.

9. An information handling system comprising:
   a printed circuit board including a first expansion terminal;
   a first guide pin operably associated with the printed circuit board and the first expansion terminal;
   a second guide pin operably associated with the printed circuit board and the first expansion terminal; and
   a first extension card including:
      a first guide block coupled to a substrate and operable to be aligned with the first guide pin;
      a second guide block coupled to the substrate and operable to be aligned with the second guide pin;
      a first coupling interface operable to engage the first expansion terminal;
      a retention mechanism operable to be coupled to at least a first exterior portion of the first expansion terminal to secure the first coupling interface to the first expansion terminal, wherein the retention mechanism includes a retaining coupler, the retaining coupler is aligned to the surface of the first coupling interface, and the retaining coupler is configured to extend away from the first coupling interface to enable the first coupling interface to couple to the first expansion terminal of the printed circuit board in response to an actuator being actuated; and
      an access terminal operably coupled to the first coupling interface, wherein the access terminal is electrically coupled the first expansion terminal to access terminal.

10. The information handling system of claim 9, wherein the retention mechanism includes a tool-less retention mechanism that is tension activated.

11. The information handling system of claim 9, further comprising:
   a second expansion terminal;
   a third guide pin operably associated with the second expansion terminal;
   a second guide pin operably associated with the second expansion terminal;
   a second extension card coupled to the second expansion terminal, the second extension card coupled to at least a portion of a second exterior surface of the second expansion terminal using a second retention mechanism.

12. The information handling system of claim 11, further comprising:
   a first resource accessible using the first extension card; and
   a second resource accessible using the second extension card.

13. The information handling system of claim 9, further comprising a PCI Express enabled riser cable coupled to the access terminal.

14. An information handling system comprising:
   a printed circuit board including a first expansion terminal;
   a first guide pin operably associated with the printed circuit board and the first expansion terminal;
   a second guide pin operably associated with the printed circuit board and the first expansion terminal; and
   a first extension card including:
      a first guide block coupled to a substrate and operable to be aligned with the first guide pin;
      a second guide block coupled to the substrate and operable to be aligned with the second guide pin;
      a first coupling interface operable to engage the first expansion terminal;
         a retention mechanism operable to be coupled to at least a first exterior portion of the first expansion terminal to secure the first coupling interface to the first expansion terminal, the retention mechanism includes a retaining coupler, and an actuator operably coupled to retaining coupler, the actuator operable to place the retaining coupler around a portion of the first exterior surface of the first expansion terminal; and
      an access terminal operably coupled to the first coupling interface, wherein the access terminal is electrically coupled the first expansion terminal to access terminal.

15. The information handling system of claim 14, wherein the retention mechanism includes a tool-less retention mechanism that is tension activated.

16. The information handling system of claim 14, further comprising:
   a second expansion terminal;
   a third guide pin operably associated with the second expansion terminal;
   a second guide pin operably associated with the second expansion terminal;
   a second extension card coupled to the second expansion terminal, the second extension card coupled to at least a portion of a second exterior surface of the second expansion terminal using a second retention mechanism.

17. The information handling system of claim 16, further comprising:
   a first resource accessible using the first extension card; and
   a second resource accessible using the second extension card.

18. The information handling system of claim 14, further comprising a PCI Express enabled riser cable coupled to the access terminal.

\* \* \* \* \*